US012635376B2

(12) United States Patent
Liu et al.

(10) Patent No.: US 12,635,376 B2
(45) Date of Patent: May 19, 2026

(54) PIXEL ARRANGEMENT STRUCTURE, DISPLAY PANEL, AND DISPLAY APPARATUS

(71) Applicant: KunShan Go-Visionox Opto-Electronics Co., Ltd, Kunshan (CN)

(72) Inventors: Mingxing Liu, Kunshan (CN); Ying Liu, Kunshan (CN); Xiaobao Zhang, Kunshan (CN); Yang Shao, Kunshan (CN); Jingjing Zhao, Kunshan (CN); Shizhen Feng, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 431 days.

(21) Appl. No.: 18/472,499

(22) Filed: Sep. 22, 2023

(65) Prior Publication Data

US 2024/0016020 A1     Jan. 11, 2024

Related U.S. Application Data

(63) Continuation of application No. PCT/CN2022/115438, filed on Aug. 29, 2022.

(30) Foreign Application Priority Data

Dec. 13, 2021    (CN) .......................... 202111518173.9

(51) Int. Cl.
*H10K 59/35*          (2023.01)

(52) U.S. Cl.
CPC ......... *H10K 59/353* (2023.02); *H10K 59/351* (2023.02); *H10K 59/352* (2023.02)

(58) Field of Classification Search
CPC ..... H10K 59/35; H10K 59/352; H10K 59/353
See application file for complete search history.

(56) References Cited

U.S. PATENT DOCUMENTS

| | | | |
|---|---|---|---|
| 9,431,469 B2 * | 8/2016 | Park ..................... | H10K 59/353 |
| 2002/0015110 A1 * | 2/2002 | Brown Elliott ...... | G09G 3/3614 |
| | | | 345/589 |
| 2004/0246426 A1 * | 12/2004 | Wang ................ | G02F 1/133514 |
| | | | 349/146 |

(Continued)

FOREIGN PATENT DOCUMENTS

| | | |
|---|---|---|
| CN | 102855820 A | 1/2013 |
| CN | 104465714 A | 3/2015 |

(Continued)

OTHER PUBLICATIONS

Office Action issued on Apr. 30, 2025, in corresponding Chinese Application No. 202111518173.9, 16 pages.

(Continued)

*Primary Examiner* — Mohsen Ahmadi
(74) *Attorney, Agent, or Firm* — Maier & Maier, PLLC

(57)          ABSTRACT

A pixel arrangement structure, a display panel and a display apparatus. First sub-pixels of the pixel arrangement have centers coincident with vertexes of a first virtual quadrilateral, a second sub-pixel and a third sub-pixel are located in the first virtual quadrilateral, and the second sub-pixel has a larger opening area than the first sub-pixel and the second sub-pixel.

18 Claims, 5 Drawing Sheets

(56)                    References Cited

U.S. PATENT DOCUMENTS

| | | | | |
|---|---|---|---|---|
| 2008/0001525 A1* | 1/2008 | Chao | H10K 59/353 | |
| | | | 313/503 | |
| 2011/0012820 A1* | 1/2011 | Kim | G09G 3/3208 | |
| | | | 345/82 | |
| 2011/0291549 A1 | 12/2011 | Kim et al. | | |
| 2011/0291550 A1* | 12/2011 | Kim | H10K 59/352 | |
| | | | 313/504 | |
| 2012/0049726 A1* | 3/2012 | Yoo | H10K 59/353 | |
| | | | 313/504 | |
| 2012/0056531 A1* | 3/2012 | Park | H10K 50/125 | |
| | | | 313/506 | |
| 2015/0192834 A1* | 7/2015 | Morinaga | G02F 1/136213 | |
| | | | 349/39 | |
| 2016/0126298 A1* | 5/2016 | Chen | H10K 59/353 | |
| | | | 257/40 | |
| 2017/0047382 A1 | 2/2017 | Huangfu et al. | | |
| 2019/0251895 A1* | 8/2019 | Zhang | G09G 3/32 | |
| 2019/0252469 A1* | 8/2019 | Xiao | G09G 3/3225 | |
| 2020/0402442 A1* | 12/2020 | Liu | H10K 59/353 | |
| 2021/0091145 A1 | 3/2021 | Huangfu et al. | | |
| 2021/0183965 A1 | 6/2021 | Wang et al. | | |
| 2021/0376010 A1* | 12/2021 | Liu | H10K 59/353 | |
| 2021/0384268 A1 | 12/2021 | Liu et al. | | |
| 2022/0005881 A1* | 1/2022 | Ma | H10K 59/353 | |
| 2022/0157897 A1* | 5/2022 | Dou | H10K 59/352 | |
| 2022/0165810 A1* | 5/2022 | Qiu | H10K 71/00 | |
| 2023/0113473 A1* | 4/2023 | Gao | G09G 3/3208 | |
| | | | 257/89 | |
| 2023/0337478 A1* | 10/2023 | Zhang | H10K 59/122 | |

FOREIGN PATENT DOCUMENTS

| | | | |
|---|---|---|---|
| CN | 104681594 A | 6/2015 |
| CN | 106098731 A | 11/2016 |
| CN | 109935617 A | 6/2019 |
| CN | 110137209 A | 8/2019 |
| CN | 110137210 A | 8/2019 |
| CN | 110277436 A | 9/2019 |
| CN | 110459574 A | 11/2019 |
| CN | 110491911 A | 11/2019 |
| CN | 111969020 A | 11/2020 |
| CN | 112201681 A | 1/2021 |
| CN | 114156332 A | 3/2022 |
| KR | 1020180084739 A | 7/2018 |
| KR | 1020190109485 A | 9/2019 |
| KR | 1020200101455 A | 8/2020 |

OTHER PUBLICATIONS

Office Action issued on Nov. 21, 2025, in corresponding Chinese Application No. 202111518173.9, 11 pages.
International Search Report (International Application No. PCT/CN2022/115438) with English Translation, dated Nov. 28, 2022, 6 pages.
Written Opinion (International Application No. PCT/CN2022/115438) with English Translation, dated Nov. 28, 2022, 6 pages.
Office Action issued on Sep. 26, 2024, in corresponding Korean Application No. 10-2023-7031450, 16 pages.

* cited by examiner

100

100

PIXEL ARRANGEMENT STRUCTURE, DISPLAY PANEL, AND DISPLAY APPARATUS

CROSS-REFERENCE TO RELATED APPLICATIONS

This application claims priority of China Patent Application No. 202111518173.9, filed on Dec. 13, 2021, entitled "PIXEL ARRANGEMENT STRUCTURE, DISPLAY PANEL, AND DISPLAY APPARATUS", the content of which is hereby incorporated by reference in its entirety. This application is a continuation under 35 U.S.C. § 120 of international patent application PCT/CN2022/115438, filed on Aug. 29, 2022, entitled "PIXEL ARRANGEMENT STRUCTURE, DISPLAY PANEL, AND DISPLAY APPA-RATUS", the content of which is also hereby incorporated by reference in its entirety.

TECHNICAL FIELD

The present application relates to the field of display technologies, and in particular to a pixel arrangement structure, a display panel, and a display apparatus.

BACKGROUND

Organic light-emitting diode (OLED) display technology is regarded as the next generation of the most promising new flat panel display technology. Currently, the OLED display panel usually uses red (R), blue (B) and green (G) pixels in a fixed arrangement structure. However, the existing pixel arrangement structure still has the problem that the display effect of the OLED device would be affected by the properties of the organic light-emitting materials.

SUMMARY

In view of this, there is need to provide a pixel arrangement structure which can achieve Real-RGB display and improve display color deviation.

In an aspect of the present application, a pixel arrangement structure is provided, comprising at least one first sub-pixel having centers coincident with vertexes of a first virtual quadrilateral, a second sub-pixel located in the first virtual quadrilateral and spaced apart from the first sub-pixels, and a third sub-pixel located in the first virtual quadrilateral and spaced apart from the first sub-pixels and from the second sub-pixel. The second sub-pixel has a larger opening area than the first sub-pixel or the third sub-pixel.

Through the above pixel arrangement structure, on one hand, the true Real-RGB display can be achieved, each pixel can display all colors, and the display details are good. On the other hand, each first sub-pixel is surrounded by the second and third sub-pixels, thereby preventing the color deviation. Moreover, the opening area of the second sub-pixel is larger than the opening area of the first sub-pixel or the third sub-pixel, which can reduce display color deviation caused by the difference in the decay rates of the organic light-emitting materials emitting different color lights to a certain extent.

In an embodiment, a minimum distance between two adjacent first sub-pixels in the first direction is a first distance X. A minimum distance between two adjacent first sub-pixels in the second direction is a second distance Y. The first distance X and the second distance Y satisfy the following condition: X=(0.8 to 1.2)×Y.

In an embodiment, the first distance X and the second distance Y satisfy the following condition: X=Y.

In an embodiment, the first sub-pixel, the second sub-pixel, and the third sub-pixel each have a polygon shape.

In an embodiment, the first sub-pixel, the second sub-pixel, and the third sub-pixel each have a quadrilateral shape.

In an embodiment, a distance between two first pixel edges of the second sub-pixel and the third sub-pixel in the same first virtual quadrilateral is the fourth length. A distance between two second pixel edges of adjacent second sub-pixel and third sub-pixel in two adjacent first virtual quadrilaterals in the second direction is the fifth length. The fourth length is equal to the fifth length.

In an embodiment, at least one pixel edge of the first sub-pixel is configured to be concave toward the center of the first sub-pixel.

In an embodiment, the pixel edge of the first sub-pixel which is concave toward the center of the first sub-pixel is in a form of a curved line or a bending line.

In an embodiment, four second sub-pixels respectively located in any four first virtual quadrilaterals adjacent to each other in the first direction and the second direction have centers coincident with vertexes of a second virtual quadrilateral. Four third sub-pixels respectively located in these four first virtual quadrilaterals adjacent to each other have centers coincident with vertexes of a third virtual quadrilateral. An area of the second virtual quadrilateral is equal to an area of the third virtual quadrilateral.

In an embodiment, the first virtual quadrilateral, the second virtual quadrilateral, and the third virtual quadrilateral are equilateral quadrilaterals with a same edge length.

In an embodiment, the first sub-pixel emits green lights, the second sub-pixel emits blue lights, and the third sub-pixel emits red lights.

In another aspect of the present application, a display panel comprising the pixel arrangement structure as described in any above embodiment is provided.

In yet another aspect of the present application, a display apparatus comprising the display panel as described in the above embodiment is provided.

BRIEF DESCRIPTION OF THE DRAWINGS

Various other advantages and benefits will become apparent to those of ordinary skill in the art upon reading the following detailed description of the preferred embodiments. The drawings are only for the purpose of illustrating a preferred embodiment and are not to be considered as limiting the present application. Also throughout the drawings, the same reference signs refer to the same components. In the drawings.

DETAILED DESCRIPTION

Figure 1:
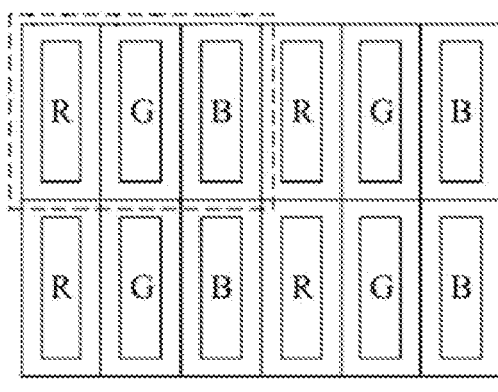
FIG. 1 is a schematic arrangement view of a pixel arrangement structure in an embodiment of the prior art.

The technical solutions in the embodiments of the present application will be clearly and completely described below in conjunction with the accompanying drawings in the embodiments of the present application. Obviously, the described embodiments are only a part of but not all of the embodiments of the present application. Based on the embodiments of the present application, all other embodiments obtained by those of ordinary skill in the art without creative efforts shall fall within the protection scope of the present application.

Any visible light in nature can be mixed from red, green, and blue lights in different proportions. The saturation of the mixed color is determined by the proportion of the three colors, and the brightness of the mixed color is the sum of the brightnesses of the three colors. Each cone cell in the human eye contains one photopigment (an erythrolabe, a chlorolabe, or a cyanolabe), and thus can perceive corresponding color. Therefore, by blending red, green, and blue colors, the human eye can perceive any kind of color change.

Sub-pixels in the display panel correspond to small grids of the displayed image. These small grids each have a specific position determined by a pixel arrangement and an assigned color value determined by a pixel circuit. When different colors need to be displayed, three sub-pixels emit lights at different brightness, respectively. Since these small grids have a very small size, they will visually blend into the desired color. Therefore, the colors and positions of the small grids determine the displayed image which can be perceived by the human eye.

One dimension to evaluate the display quality is the display resolution, which refers to the precision of the displayed image, specifically, how many sub-pixels the display panel can display. For example, common resolutions include HD:720×1280, FHD:1080×1920, QHD:1440×2560, and UHD(2K\4K):2160×3840. Taking FHD as an example, it means that there are 1080 R sub-pixels, 1080 G sub-pixels, and 1080 B sub-pixels in one direction, and 1920 R sub-pixels, 1920 G sub-pixels, and 1920 B sub-pixels in the other direction.

Another dimension to evaluate the display quality is Pixels Per Inch (PPI), also known as pixel density, which refers to the number of pixels per inch. For example, FHD resolution with a 5-inch size has a pixel density of 441PPI. Therefore, with a fixed size of the display panel, the higher the resolution, the higher the PPI may be.

Yet another dimension to evaluate the display quality is the aperture ratio. Usually, when we watch a display, we could not notice any non-light-emitting regions on the display panel. However, with a magnifying glass, we can see that there are many non-light-emitting regions. Where are these black non-light-emitting regions? They are covered by the light-emitting regions. In other words, the lights emitted by the sub-pixels are evenly distributed to the non-lightemitting regions, and the brightness of the sub-pixels are shared with the non-light-emitting regions. As a result, the display screen is not so bright, as the average brightness is not as high as the brightness of a single sub-pixel. Therefore, there is need to increase the aperture ratio of the display panel, which means reducing the areas of the black non-light-emitting regions and increasing the areas of the light-emitting regions to achieve better display quality. In addition, increasing the aperture ratio is also beneficial for extending the life of the sub-pixels.

In the liquid crystal display (LCD) technology, the conventional Real-RGB pixel arrangement is mostly adopted. As shown in FIG. 1, the size ratio of the sub-pixels in the conventional Real-RGB pixel arrangement is 1:1:1. That is, one square pixel is divided into three equal parts which are arranged side by side and assigned with different colors to constitute a color pixel. As such, pixels with high independence are achieved, and each pixel can display all colors, resulting in better display details.

However, in the organic light-emitting diode (OLED) display technology where the OLED display panel is current-driven, a pixel-driving circuit is required to be connected to the sub-pixel of the OLED display, in order to provide the electric current for the OLED device to enable the OLED device to emit lights. The OLED device includes at least an anode, a cathode, and an organic light-emitting material layer located between the anode and the cathode. Taking the top-emitting OLED display panel as an example, due to the poor stability of the organic light-emitting material, conventional etching processes cannot be used to pattern the organic light-emitting material layer. Instead, a vapor deposition process with a mask can be used to pattern the organic light-emitting material layer. Specifically, the organic light-emitting material is placed in a vacuum environment and evaporated or sublimated by heating, so as to be vapor-deposited onto the display substrate. A mask is positioned between a chamber for evaporating the organic light-emitting material and the display substrate to be vapor-deposited. The mask is provided thereon with openings corresponding to the regions to be vapor-deposited and no opening corresponding to the regions not to be vapor-deposited. The evaporated or sublimated organic light-emitting material molecules are adhered to the display substrate to be vapor-deposited through the openings, thereby directly forming a patterned organic light-emitting material layer. The mask used for vapor-deposition of the organic light-emitting material layers of various sub-pixels is a fine metal mask (FMM), also known as a fine mask. It is very difficult to produce a fine metal mask, and it becomes more difficult and costly especially as the number of openings on a fine metal mask is increasingly more with the resolution of the display product which becomes higher and higher. In addition, defects in the fine metal mask can cause color mixing and other defects in an OLED device, and the more times the fine metal mask is used, the more likely it is to produce a defective product, thereby reducing the yield of product.

Figure 2:
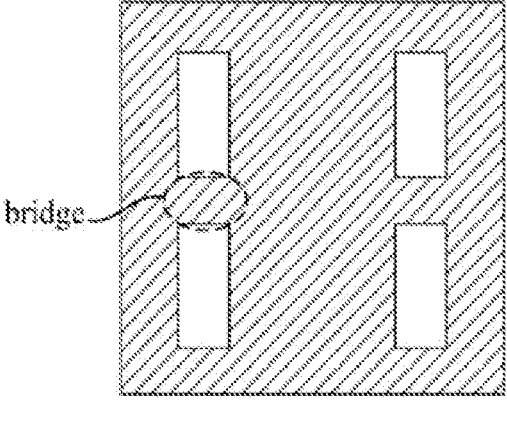
FIG. 2 is a structural schematic view of a mask for manufacturing the pixel arrangement structure in FIG. 1.

As shown in FIG. 2, in the OLED display technology, when the conventional Real-RGB pixel arrangement is used, if the pitch between two sub-pixels is too small, the connecting part (bridge) between the two deposition openings of the mask would have the risk of breaking, and the alignment interval between the mask and the sub-pixels would be reduced, which may have the defects of color missing or mixing. If the width of the connecting part is increased, then the size of the sub-pixels needs to be reduced, which affects the aperture rate of the OLED display and is not conducive to the realization of high resolution. Therefore, in the OLED display technology, when the conventional Real-RGB pixel arrangement is used, the pitch between the sub-pixels is relatively large, which causes the opening areas of the sub-pixel relatively to be small under the same resolution. Thus, not only the aperture ratio is affected, but also the driving current needs to be increased to meet the requirement on the display brightness, which is not conducive to the life of the display panel.

In view of the above, an improved RGB-Pentile pixel arrangement on basis of the conventional Real-RGB pixel arrangement has been proposed, wherein in each row of sub-pixels, the red sub-pixels, the green sub-pixels, and the blue sub-pixels are arranged alternately, with the sub-pixels in each single color arranged in a column. Compared to the conventional Real-RGB pixel arrangement, the number of the sub-pixels is reduced, and the areas of the red and blue sub-pixels are increased, resulting in higher visual brightness at the same brightness level and lower cost due to fewer sub-pixels. However, when displaying the color such as yellow and displaying the color segmentation region, the color segmentation region would have jagged edges. In addition, the arrangement of green sub-pixels in column tends to produce a colorful edge, and the display details are not as good as the conventional Real-RGB pixel arrangement due to the reduction of the number of the sub-pixels.

Figure 3:
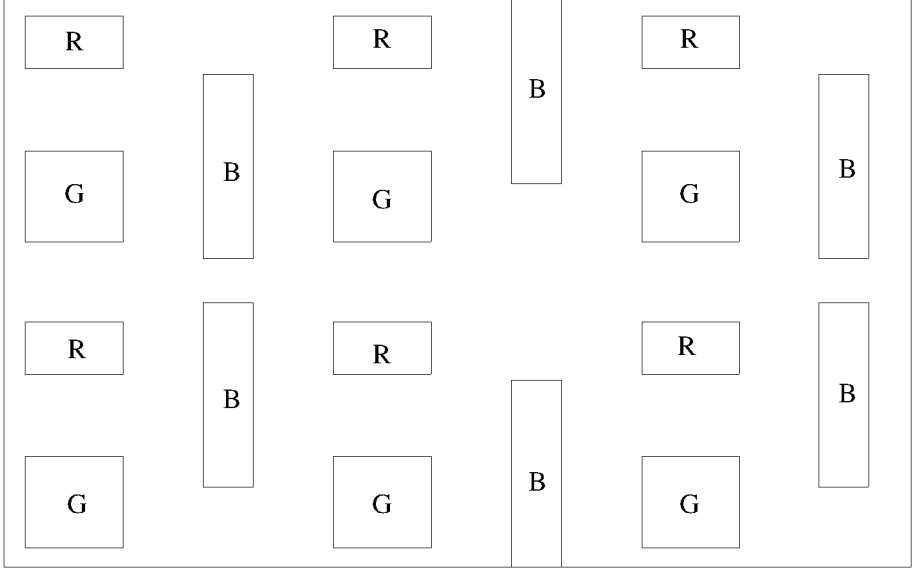
FIG. 3 is a schematic arrangement view of a pixel arrangement structure in another embodiment of the prior art.

In view of the above, another Real-RGB pixel arrangement has been proposed, wherein the red and green sub-pixels are arranged in one column and the blue sub-pixels are arranged in another column, as shown in FIG. 3. However, such pixel arrangement tends to produce uneven blue display and show blue stripes in the display panel for low PPI display e.g., below 300PPI, due to the blue sub-pixels being too close to each other. As a result, the display panel cannot achieve uniform display effect, thereby affecting the user experience and going against the visual effects that people pursue.

Figure 4:
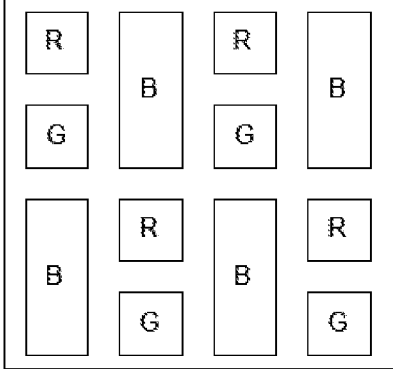
FIG. 4 is a schematic arrangement view of a pixel arrangement structure in yet another embodiment of the prior art.

In view of the above, yet another Real-RGB pixel arrangement has been proposed, wherein a repeating unit constituted by the red, green, and blue sub-pixels is repeatedly arranged in the row direction, and the repeating units in the adjacent rows are alternatively arranged so that the red, green, and blue sub-pixels in each column are alternatively arranged, as shown in FIG. 4. However, in such pixel arrangement, the green sub-pixels are offset in the column direction, which can also result in the jagged edge in the segmentation region when for example displaying yellow and displaying the color segmentation region.

To address the above problems, the embodiments of the present application provide a pixel arrangement structure, a display panel, and a display apparatus. Due to the new Real-RGB pixel arrangement, not only each pixel can display all colors and the display details are better, but also that the display uniformity is improved while the aperture ratio is increased, and the display color deviation and the jaggedness are alleviated. In addition, the pixel arrangement in the embodiments of the present application have no stripe for low PPI display, e.g., below 300PPI, thereby ensuring better display quality.

It is to be noted and those skilled in the art should understand that the sub-pixels should be distributed as evenly as possible on basis of the pixel arrangement structure of the present application.

Figure 5:
FIG. 5 is a schematic plane view of a display panel in an embodiment of the present application.
Figure 6:
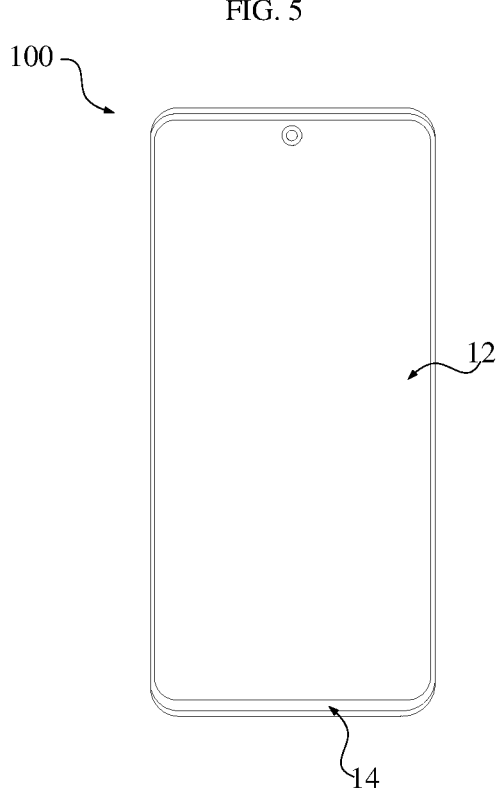
FIG. 6 is a schematic plane view of a display panel in another embodiment of the present application.

FIG. 5 shows a schematic plan view of a display panel in an embodiment of the present application. FIG. 6 shows a schematic plan view of a display panel in another embodiment of the present application.

Referring to FIGS. 5 and 6, the display panel in at least one embodiment of the present application includes a display region 12 and a non-display region 14. The display panel displays an image through a plurality of sub-pixels arranged in the display region 12. Specifically, the display region 12 can be rectangular, and the non-display region 14 is configured to surround the display region 12. Of course, the shapes and the arrangements of the display region 12 and the non-display region 14 are not limited to the above embodiments. For example, when the display panel is used in a wearable apparatus worn by a user, the display region 12 can have a circular shape like a wristwatch. When the display panel is used for the display in a vehicle, the display region 12 and the non-display region 14 can be circular, polygonal, or other shapes. The display region 12 is provided with a plurality of sub-pixels for emitting lights in different colors.

Figure 7:
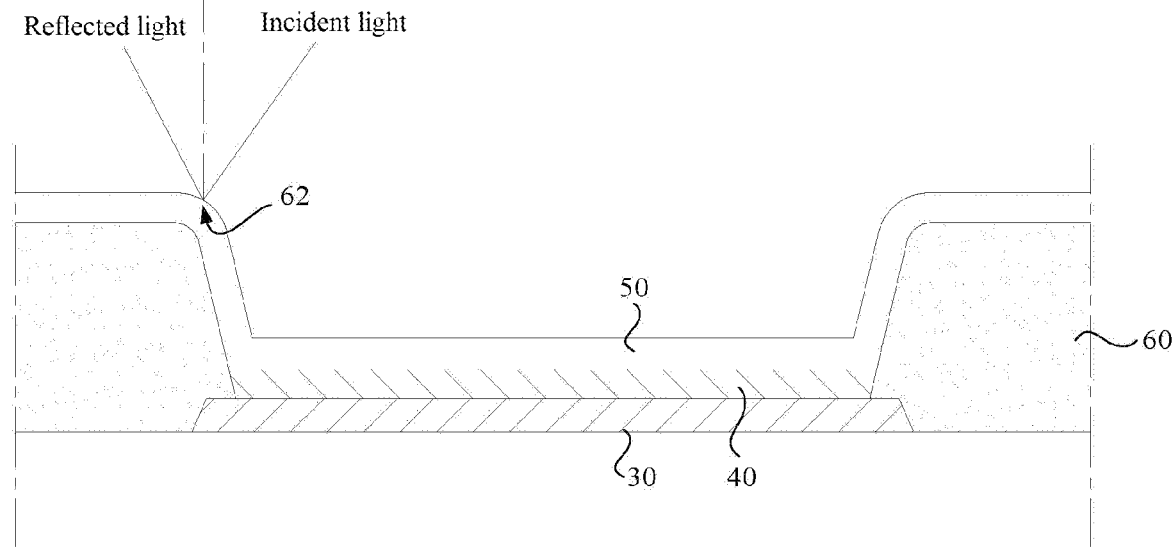
FIG. 7 is a schematic sectional view of a display panel in an embodiment of the present application.
Figure 8:
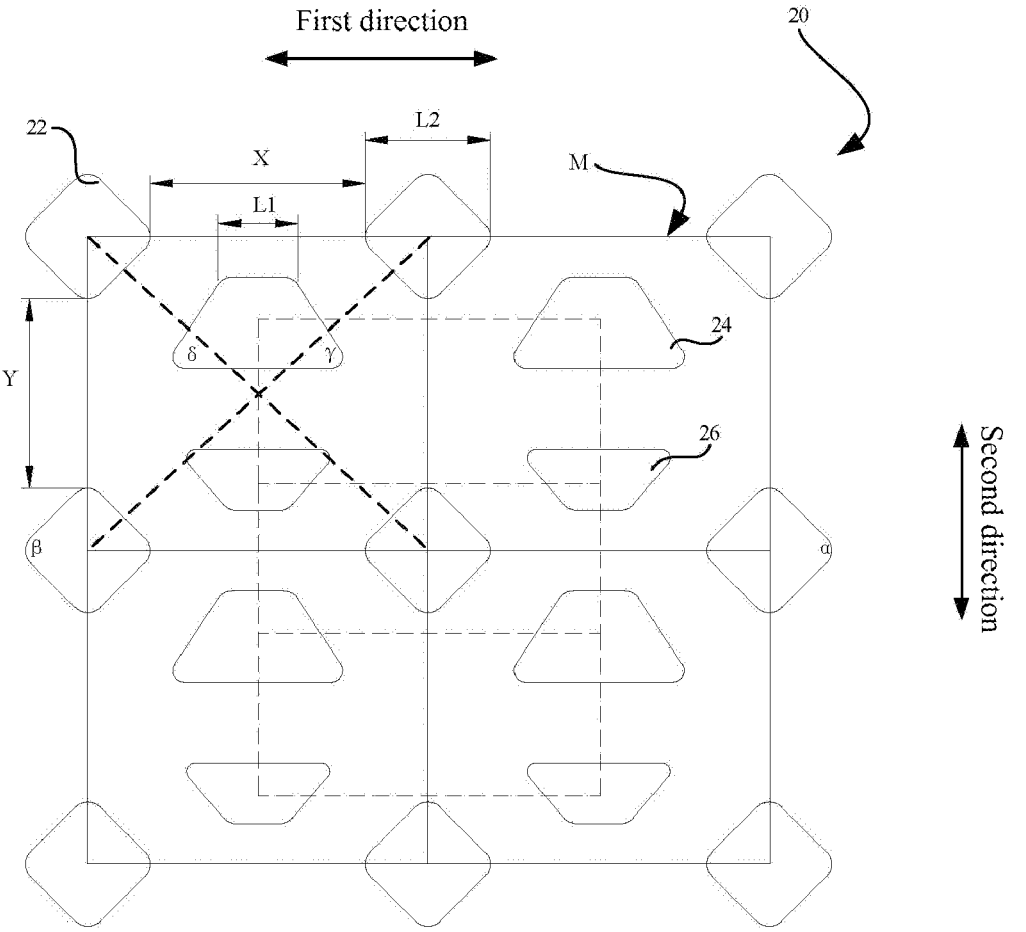
FIG. 8 is a schematic arrangement view of a pixel arrangement structure in an embodiment of the present application.

FIG. 7 shows a schematic cross-sectional view of a display panel in an embodiment of the present application. FIG. 8 shows a schematic arrangement view of a pixel arrangement structure in an embodiment of the present application.

Referring to FIGS. 7 and 8, the pixel arrangement structure 20 in at least one embodiment disclosed by the present application includes a plurality of first sub-pixels 22, a plurality of second sub-pixels 24, and a plurality of third sub-pixels 26.

The sub-pixel is defined as the smallest unit for emitting lights, e.g., the smallest addressable unit of the display panel. In an embodiment, the display panel can be an OLED display panel. The sub-pixel includes at least an anode 30, a cathode 50, and a light-emitting unit 40 located between the anode 30 and the cathode 50. A driving circuit applies a voltage between the anode 30 and the cathode 50 to excite carriers to migrate and act on the organic light-emitting layers in the light-emitting units 40, to cause the light-emitting units 40 to emit lights in different colors. It is to be understood that the light-emitting unit 40 in the present application can specifically include an electron injection layer, an electron transport layer, an organic light-emitting layer, a hole transport layer, a hole injection layer, and the like which are stacked with each other. The electron injection layer, the electron transport layer, the hole transport layer, or the hole injection layer can be an entire layer structure formed using a common metal mask (CMM). Taking the electron injection layer as an example, the electron injection layers of the plurality of sub-pixels are connected to each other to collectively form a continuous and entire layer structure. Whereas the organic light-emitting layer is a patterned layer structure corresponding to each sub-pixels, i.e., a film/layer formed using a fine metal mask (FMM).

The plurality of first sub-pixels 22 are arranged spaced apart from each other, and have centers coincident with vertexes of first virtual quadrilaterals M. For example, in the pixel arrangement as shown in FIG. 8, the plurality of first sub-pixels 22 are arranged in rows in a first direction and in columns in a second direction perpendicular to the first direction. Lines connecting centers of four adjacent first sub-pixels 22 form a first virtual quadrilateral M which is rectangular. The first sub-pixels 22 can have a polygonal shape. For example, in some embodiments, the first sub-pixels 22 can have the same quadrilateral shape such as a square or a diamond. Of course, in other embodiments, the first sub-pixels 22 can have one or more of various polygonal shapes such as pentagon, hexagon, and heptagon.

The second sub-pixel 24 is located within the first virtual quadrilateral M and is spaced apart from the first sub-pixels 22. The third sub-pixels 26 is also located within the first virtual quadrilateral M and is spaced apart from both the first sub-pixels 22 and the second sub-pixel 24. That is, the first virtual quadrilateral M formed by the four first sub-pixels 22 surrounds one second sub-pixel 24 and one third sub-pixel 26 which are spaced apart from each other and also spaced apart from the four first sub-pixels 22. The second sub-pixel 24 and the third sub-pixel 26 can both have a polygonal shape. For example, in the pixel arrangement structure 20 as shown in FIG. 8, the second sub-pixel 24 and the third sub-pixel 26 have different quadrilateral shapes from the first sub-pixels 22.

It is to be noted that the first sub-pixels 22 can have the centers coincident with the vertexes of the first virtual quadrilaterals M in order to ensure the uniform distribution of the sub-pixels. However, in other embodiments, the centers of the sub-pixels may also have an offset within a tolerance range from the vertexes of the first virtual quadrilaterals M. Therefore, when referring to that the centers of the sub-pixels coincide with the vertexes of the virtual quadrilaterals, it should not be understood as requiring the centers of the first sub-pixels 22 to be 100% coincident with the vertexes of the first virtual quadrilaterals M, which may limit the scope of protection.

It is to be understood that in some embodiments, the shapes of the sub-pixels are relatively regular, and the centers of the sub-pixels can be the geometric centers of the shapes of the sub-pixels. In this case, centers of light-emitting regions of the sub-pixels coincide with the geometric centers of the shapes of the sub-pixels. In other embodiments, due to the shape design of the sub-pixels, the centers of the light-emitting regions of the sub-pixels may not coincide with the geometric centers of the shapes of the sub-pixels. In this case, the centers of the sub-pixels can also be the centers of the light-emitting regions of the sub-pixels, which is not limited herein.

In the embodiments of the present application, the first sub-pixel 22, the second sub-pixel 24, and the third sub-pixel 26 can each be one of a red sub-pixel, a blue sub-pixel, and a green sub-pixel. Of course, in other embodiments, the first sub-pixel 22, the second sub-pixel 24, or the third sub-pixel 26 can also be a sub-pixel emitting a color other than red, green, and blue, such as white or yellow, which is not limited herein.

It is to be understood that lights in different colors have different wavelengths. The shorter the wavelength, the higher the energy of the light. High-energy light tends to cause the decay of the organic light-emitting material, so that the sub-pixel emitting high-energy lights is more prone to decay. It is well known that the wavelength of the blue light is shorter than those of the red light and the green light, so the blue light has higher energy, and the organic light-emitting material emitting the blue light is more prone to decay, as a result, the lights emitted by the sub-pixels tend to be reddish, causing the phenomenon of white light color deviation. Moreover, the lights emitted by each sub-pixel are repeatedly reflected and re-reflected between the anode 30 and the cathode 50 through the microcavity effect, which causes amplification and constructive interference, so that the brightness of the lights are improved, and the color deviation is further amplified. In the embodiments of the present application, the second sub-pixel 24 has a larger opening area than the first sub-pixel 22 or the third sub-pixel 26, so the second sub-pixel 24 can be set as a sub-pixel emitting blue light, and the first sub-pixel 22 and the third sub-pixel 26 can be set as sub-pixels emitting green light and red light. In this way, the display defect caused by the difference in the decay rates of the organic light-emitting materials emitting different colors of light can be reduced to a certain extent.

In some embodiments, the first sub-pixel 22 can be set to emit green light, the second sub-pixel 24 can be set to emit blue light, and the third sub-pixel 26 can be set to emit red light. In this way, on one hand, the true Real-RGB display can be achieved, the sub-pixels can be arranged more compactly, and the aperture ratio of the sub-pixels can be increased. On the other hand, each green sub-pixel is surrounded by the blue and red sub-pixels, which can prevent the color deviation. For example, when white light is formed by mixing red, green, and blue lights, it can be mixed in an approximately ratio of 30% red light, 60% green light, and 10% blue light. Compared with other forms of arrangement, by setting the first sub-pixel 22 as the green sub-pixel, it can enable the color to be mixed more uniformly and the color deviation to be improved better.

In some embodiments of the present application, the pixel arrangement structure 20 includes a plurality of first virtual quadrilaterals M repeatedly arranged. The plurality of first virtual quadrilaterals M are arranged in an array by sharing virtual edges. Specifically, in the embodiment as shown in FIG. 8, the first virtual quadrilaterals M are arranged in rows in the first direction and in columns in the second direction perpendicular to the first direction. Any two adjacent first virtual quadrilaterals M share a common virtual edge. In this way, the sub-pixels can be arranged compactly, thereby making full use of space and increasing the aperture ratio.

It is to be understood that the plurality of first virtual quadrilaterals M arranged in an array refers to that the centers of the plurality of first virtual quadrilaterals M are spaced apart in at least two directions to form the array. For example, the centers of the plurality of first virtual quadrilaterals M can be spaced apart in the first direction and the second direction perpendicular to each other to form the array. The rows and columns of the first virtual quadrilaterals M in the display panel are relative, and the first virtual quadrilaterals M arranged in rows can be the first virtual quadrilaterals M arranged in columns in other embodiments.

In an embodiment, the first virtual quadrilaterals M are rectangular. That is, the first sub-pixels are arranged in rows in the first direction and in columns in the second direction. In this way, when the firs sub-pixels 22 are set as green sub-pixels to which the human eye are more sensitive, the first sub-pixels 22 can be arranged in lines respectively in the first direction and the second direction. That is, the centers of the first sub-pixels 22 arranged in one row in the first direction are located on the same straight line, and the centers of the first sub-pixels 22 arranged in one column in the second direction are located on the same straight line. Therefore, the pixel arrangement structure 20 in the embodiments of the present application is more visually uniform.

Furthermore, the second sub-pixels 24 located in the first virtual quadrilaterals M can also be arranged in a straight line in the first direction. That is, the centers of the second sub-pixels 24 arranged in one row in the first direction are located on the same straight line. Likewise, the third sub-pixels 26 can also be arranged in a straight line in the first direction. That is, the centers of the third sub-pixels 26 arranged in one row in the first direction are located on the same straight line. In this way, on one hand, the second sub-pixels 24 and the third sub-pixels 26 can form straight line arrangements with better consistency in the first direction, and with the first sub-pixels 22 arranged in the straight line, the pixel arrangement structure 20 can be more uniform in both the first and second directions. On the other hand, the white dots formed in the pixel arrangement structure 20 can be more uniform, thereby improving the display quality.

In some embodiments, the two first sub-pixels 22 located on the diagonal are spaced apart from each other in such a way that the second sub-pixel 24 and the third sub-pixel 26 are located therebetween. In some embodiments, the center line connecting the two first sub-pixels 22 on the diagonal passes through the second sub-pixel 24 and the third sub-pixel 26 located in the corresponding first virtual quadrilateral M. In this way, on one hand, the second sub-pixel 24 and the third sub-pixel 26 can be reasonably arranged in the first virtual quadrilateral M, so as to take in account both the compactness of the sub-pixel arrangement and the distance between the sub-pixels and thus find a balance therebetween to make the positions and distances of the second sub-pixel 24 and the third sub-pixel 26 relative to the first sub-pixel 22 more compact and uniform, thereby allowing the color mixing to be more uniform and better improving the color deviation. On the other hand, it can also improve the uniformity of color mixing of the second sub-pixel 24 and the third sub-pixel 26 with the first sub-pixel 22, thereby further preventing the color deviation.

It is to be understood that the pixel arrangement structure 20 directly determines the display effect. In order to ensure uniform display, the sub-pixels are usually arranged as evenly as possible in the row and column directions according to a certain rule. However, due to the properties of the organic light-emitting materials emitting lights in different colors, the color deviation cannot be completely avoided. In an optional embodiment, a line connecting centers of the second sub-pixel 24 and the third sub-pixel 26 located in the first virtual quadrilateral M passes through the center of the first virtual quadrilateral M. In this way, the second sub-pixels 24 and the third sub-pixels 26 can be alternately arranged in the first direction or the second direction while ensuring that the sub-pixels are arranged as evenly as possible, which can reduce the risk of color deviation caused by the accumulation of a single color and improve the image quality.

In some embodiments, four second sub-pixels 24, which are respectively located within any four first virtual quadrilaterals M adjacent to each other in the first direction and the second direction, have centers coincident with vertexes of a second virtual quadrilateral (not shown). Four third sub-pixels 26, which are respectively located within these four first virtual quadrilaterals M adjacent to each other in the first direction and the second direction, have centers coincident with vertexes of a third virtual quadrilateral (not shown). The area of the second virtual quadrilateral is equal to the area of the third virtual quadrilateral. In an optional embodiment, the first virtual quadrilateral M, the second virtual quadrilateral, and the third virtual quadrilateral are all equilateral quadrilaterals. In addition, the first virtual quadrilateral M, the second virtual quadrilateral, and the third virtual quadrilateral have equal edge lengths.

In this way, the pixel arrangement structure 20 can arrange pixels more evenly in the first and second directions, thereby improving the display quality.

Referring to FIG. 7, the display panel in the embodiments of the present application can further include a pixel definition layer 60. The pixel definition layer 60 defines a plurality of pixel openings. The organic light-emitting layers of the sub-pixels are configured in the pixel openings to avoid cross color or interference between adjacent sub-pixels. Therefore, the pixel edge of the sub-pixel is the boundary of the pixel opening defined by the pixel definition layer 60. The area of the sub-pixel is the area of the pixel opening, which is also the light-emitting area of the sub-pixel. The distance between the sub-pixels is the distance between the pixel edges of the sub-pixels. However, due to the limitations of the current vapor deposition technology, in order to ensure that the light-emitting material is completely vapor-deposited into the pixel opening, an opening area of the mask is generally larger than the area of the pixel opening, so as to leave a vapor deposition margin. For example, a distance between each pixel edge of the sub-pixel and the projected contour boundary of the deposition opening of the mask on the display substrate is the aforementioned vapor deposition margin. In some embodiments, the projected contour boundary of the deposition opening of the mask on the display substrate and the pixel edge of the corresponding sub-pixel are kept parallel to each other and at an equal perpendicular distance. In this way, the final sub-pixel arrangement is more uniform and regular, which can effectively improve the manufacturing accuracy and yield of the light-emitting layer of the sub-pixel and reduce the risk of folding during stretching of the mask.

It is to be understood that in order to achieve a higher PPI, the arrangement of the sub-pixels should be more compact. Therefore, in some embodiments, under the condition of meeting the extreme process, the distance between adjacent pixel edges of two adjacent sub-pixels is equal to the sum of the deposition margins for vapor-depositing the two adjacent sub-pixels. That is to say, under the condition of meeting the extreme process, the deposition openings of the mask corresponding to the two adjacent sub-pixels have overlapped parts on the projected contour boundaries thereof on the display substrate. The overlapped parts form a dividing line between the two adjacent sub-pixels. Of course, in other embodiments, the arrangement of some sub-pixels can be relatively sparse compared to the arrangement that meets the extreme process. That is, the distance between the pixel edges of two adjacent sub-pixels is larger than the sum of the deposition margins for vapor depositing the two adjacent sub-pixels. In this case, the projected contour boundaries of the deposition apertures of the mask on the display substrate corresponding to the two adjacent sub-pixels are spaced apart from each other. In an optional embodiment, the adjacent pixel edges of the two adjacent sub-pixels are parallel to each other. In this case, a dividing line between the two adjacent sub-pixels is the perpendicular bisector of the perpendicular line between the adjacent pixel edges of the two adjacent sub-pixels.

In some embodiments, a minimum distance between two adjacent first sub-pixels 22 in the first direction is a first distance X. A minimum distance between two adjacent first sub-pixels 22 in the second direction is a second distance Y. The first distance X and the second distance Y satisfy the condition: $X=(0.8\sim1.2)\times Y$. For example, in the embodiment as shown in FIG. 8, the first sub-pixel 22 has a quadrilateral shape which is defined by pixel edges that are not parallel to the first direction or the second direction. That is, each pixel edge of each first sub-pixel 22 can be set at an angle with the first direction and at an angle with the second direction. The minimum distance between two adjacent first sub-pixels 22 in the first direction is a distance between vertexes of two vertex angles of the two adjacent first sub-pixels 22. Likewise, the minimum distance between two adjacent first sub-pixels 22 in the second direction is a distance between vertexes of two vertex angles of the two adjacent first sub-pixels 22. In this way, the first sub-pixel 22 can be set as a green sub-pixel to which the human eye is higher sensitive, and the distances between two adjacent first sub-pixels 22 in the first direction and the second direction are approximate, which further makes the pixel arrangement structure 20 in the embodiments of the present application more visually uniform.

In some embodiments, the first distance X and the second distance Y satisfy the condition: X=Y. Specifically, in the embodiment as shown in FIG. 8, the first virtual quadrilateral M is a square.

It is particularly emphasized that, referring to FIGS. 7 and 8, the pixel definition layer 60 defines the pixel openings for disposing the organic light-emitting layers. When the ambient lights are incident on the edges 62 of the pixel openings at a specific angle, the ambient lights are diffusely reflected. In this case, the diffusely reflected lights can be perceived by the user who watches the display panel at a specific angle, which will reduce the ambient contrast of the display panel. By configuring the shape of the first sub-pixel 22 as being defined by the pixel edges not parallel to the first direction or the second direction, the ambient lights from outside are diffusely reflected by the edges 62 of the pixel openings that are not parallel to the first direction or the second direction, thereby changing the direction of the scattered lights undergone the diffuse reflection. As the direction is changed, the scattered lights would not be perceived by the user, which prevents the scattered lights undergone the diffuse reflection from mixing with the lights spontaneously emitted by the organic light-emitting layers in the sub-pixels, thereby enhancing the ambient contrast.

Likewise, in some embodiments, the shapes of the second sub-pixel 24 and the third sub-pixel 26 can also be configured as being defined by pixel edges that are not parallel to the first direction or the second direction, which can also prevent the scattered lights undergone the diffuse reflection from mixing with the lights spontaneously emitted by the organic light-emitting layers in the sub-pixels, thereby enhancing the ambient contrast.

In some embodiments, any two adjacent first sub-pixels 22 have two vertex angles opposite to each other. It is to be understood that, while minimizing the amount of the scattered lights undergone the diffuse reflection which may enter the user's field of view, the difficulty in manufacturing the fine metal mask and stretching the mask should also be considered. The present inventors have found that during the manufacture of the display panel, for example, when stretching the mask in the first direction, the mask would shrink inward in the non-stretched direction, e.g., the second direction. When the mask is stretched, the stretching force would cause the angles of the pixel opening corresponding to the vertex angles opposite to each other in the stretching direction, e.g., the first direction, to change in the direction of increasing the angle. The angles of the pixel opening corresponding to the vertex angles opposite to each other in the stretching direction can provide some guidance for the inward shrinking to prevent the mask from folding when stretching, which can cause the change in the positions of the pixel openings and positions for vapor depositing sub-pixels and thus the color mixing with other sub-pixels. In addition, the angles of the deposition opening corresponding to another pair of vertex angles of the sub-pixel in the non-stretching direction, e.g., the second direction, can also counteract the inward shrinking to further prevent the mask from folding when stretching. Besides, since the pair of vertex angles of each first sub-pixel 22 protrudes outward in the direction away from the center of the sub-pixel, when stretching, the vertexes of the angles of the pixel opening corresponding to this pair of vertex angles opposite to each other tends to move in the direction towards the center of the adjacent pixel opening, which counteracts with each other and reduces the changes in the shape and position of the pixel opening, further avoiding mixing colors.

In some embodiments, one of any two adjacent first sub-pixels 22 is configured to be symmetrical about an extension of a line connecting centers of the two adjacent first sub-pixels 22. Specifically, in the embodiment as shown in FIG. 8, in the first direction, the extension of the line connecting centers of two adjacent first sub-pixels 22 passes through vertexes of the aforementioned first vertex angles α and second vertex angles β. In the second direction, the extension of the line connecting centers of two adjacent first sub-pixels 22 passes through vertexes of another pairs of vertex angles opposite to each other of the first sub-pixels 22. In this way, the deposition openings of the mask are uniformly stressed during the stretching of the mask, avoiding large deformation of the pixel openings due to uneven stress which may affect the vapor deposition of the organic light-emitting layers of the sub-pixels. In addition, the shapes of the sub-pixels can be more regular, which is conducive to the uniform arrangement of the sub-pixels and improves the display quality.

In addition, the geometric center of the sub-pixel is usually its visual focus. By configuring the shape of the first sub-pixel 22 as being defined by pixel edges that are not parallel to the first direction or the second direction, and configuring any two adjacent first sub-pixels 22 to be symmetrical about the extension of the line connecting the centers thereof, the widths of the first sub-pixel 22 in the first and second directions can be continuously and uniformly changed in a regular manner, which allows a distance between the visual focuses of two adjacent first sub-pixels 22 to be in a reasonable range, so that the human eye can accurately distinguish two adjacent sub-pixels with the same color, ensuring that the visual resolution of the display panel is the same as its physical resolution, the displayed image on the display panel is delicate and clear, and the display panel has good display effect.

It is also to be understood that the size of the deposition openings of the mask used in the vaper deposition process corresponds to the size of the organic light-emitting functional layer. When the vertex angle of the first sub-pixel 22 is too small, the size of the corresponding angle of the deposition opening of the mask is small, which makes the manufacture of the mask difficult. In addition, when a patterned layer/film structure with a small vertex angle is formed using the vapor deposition process, a small process error will cause large change in the above-mentioned vertex angle. Therefore, a small vertex angle of the first sub-pixel 22 would increase the difficulty of manufacturing the display panel. In an embodiment, the vertex angle of the first sub-pixel 22 is in a range of 80° to 100°, so that it is less difficult to manufacture the mask for the organic light-emitting layers in the first sub-pixels 22, and to manufacture a display panel.

It is to be noted that the vertex angle of the first sub-pixel 22 within 80° to 100° in the previous embodiment can also reduce the marginal sawtooth of the displayed image and thus improve the quality of the displayed image.

In addition, in the pixel arrangement structure 20, the sub-pixels should be compactly and uniformly arranged, while also taking into account the opening areas and the aperture rate of different sub-pixels. By setting the vertex angle of the first sub-pixel 22 within 80° to 100°, and making the angle of the adjacent second sub-pixel 24 and third sub-pixel 26 close to this vertex angle be an obtuse angle, the shapes of the second sub-pixel 24 and third sub-pixel 26 can complement with at least a portion of the shape of two adjacent first sub-pixels 22, thereby effectively utilizing the space of the display panel, reducing the area of the blank region between adjacent sub-pixels, and increasing the aperture rate of the display panel.

It is to be understood that when the shape of the first sub-pixel 22 is configured as being defined by pixel edges that are not parallel to the first direction and the second direction, in order to effectively utilize the space of the display panel, reduce the area of the blank region between adjacent sub-pixels, and increase the aperture rate of the display panel, in some embodiments, each sub-pixel of the second sub-pixels 24 and the third sub-pixels 26 has a pixel edge that is not parallel to the first direction and the second direction. The pixel edges of the second sub-pixel 24 and the third sub-pixel 26 that are not parallel to the first direction or the second direction are opposite to the adjacent pixel edge of the adjacent first sub-pixel 22. For example, as shown in FIG. 8, the second sub-pixel 24 and the third sub-pixel 26 each have a pixel edge adjacent and opposite to the corresponding pixel edge of the adjacent first sub-pixel 22, and this pixel edge is also configured to be not parallel to the first direction or the second direction, i.e., forming an angle with the first direction or the second direction.

In some embodiments, the second sub-pixel 24 and the third sub-pixel 26 are set to have non-equilateral quadrilateral shapes. In the second direction, one of the second sub-pixel 24 and the third sub-pixel 26 has a first pixel edges (not shown) and a second pixel edge (not shown) opposite to each other. The length of the first pixel edge is larger than the length of the second pixel edge of the same sub-pixel. In the same first virtual quadrilateral M, the two first pixel edges of the second sub-pixel 24 and the third sub-pixel 26 are adjacent and parallel to each other. Two second pixel edges in two adjacent first virtual quadrilaterals M in the second direction are adjacent and parallel to each other. One of the second sub-pixel 24 and the third sub-pixel 26 also has a third pixel edge and a fourth pixel edge connecting the first pixel edge and the second pixel edge. The third pixel edge and the fourth pixel edge are set at an angle with the first direction or the second direction. Furthermore, the first pixel edge and the second pixel edge of the second sub-pixel 24 and the third sub-pixel 26 are both parallel to the first direction. In this way, not only the opening areas of the second sub-pixel 24 and the third sub-pixel 26 are ensured in order to obtain higher resolution under the same display panel size, but also the risk of deposition color mixing between different color sub-pixels is reduced. Under the aforementioned constraints, the maximum aperture rate of each sub-pixel in the pixel arrangement structure 20 is achieved while satisfying the extreme process conditions.

In some embodiments, the second pixel edge of the second sub-pixel 24 has a first length L1. In the first direction, a maximum size of the first sub-pixel 22 is a second length L2, where L2=(1.5 to 2.5)L1. It is easy to understand that since the shape of the first sub-pixel 22 is defined by pixel edges that are not parallel to the first direction or the second direction, the size of the first sub-pixel 22 in the first direction is not constant but varied regularly along the second direction. For example, in a specific embodiment as shown in FIG. 8, in the first direction, a line passing through the vertexes of the first vertex angle α and the second vertex angle β opposite to each other of the first sub-pixel 22 passes through the center of this first sub-pixel 22. In the second direction, a line passing through the vertexes of another pair of opposite vertex angles of the first sub-pixel 22 also passes through the center of this first sub-pixel 22. Then, the size of the first sub-pixel 22 in the first direction gradually increases and then gradually decreases along the second direction, and the maximum size of the first sub-pixel 22 in the first direction is the distance between the vertexes of the first vertex angle and the second vertex angle opposite to each other of the first sub-pixel 22.

It is to be understood that due to process technology and cost limitations, generally, the fine metal mask is longitudinally stretched and the deposition opening is longitudinally extended, e.g., in the first direction, to ensure good vapor deposition effects. Considering the aperture rate of sub-pixels, the display uniformity, and the manufacture difficulty of the mask, the shape, the transverse size, and the longitudinal size of the deposition opening are interrelated. Accordingly, the shape, the transverse size, and the longitudinal size of the sub-pixels also are correspondingly interrelated. Therefore, the maximum size of the first sub-pixel 22 in the first direction would limit the shape and the size of the first sub-pixel 22. In order to make the shapes of the second sub-pixel 24 and the third sub-pixel 26 at least partially complementary with the two first sub-pixels 22, thereby reducing the area of the blank region between adjacent sub-pixels and increasing the aperture rate of the display panel, it also needs to ensure that the second sub-pixel 24 and the third sub-pixel 26 are evenly spaced from the adjacent first sub-pixel 22. In this case, the lengths of the second pixel edges of the second sub-pixel 24 and the third sub-pixel 26 would affect the shapes and sizes of the second sub-pixel 24 and the third sub-pixel 26, when other parameters such as the area of the display panel, the resolution, PPI, and the aperture rate are fixed.

By setting the second length L2 as 1.5 to 2.5 times the first length L, the shape and the size of each sub-pixel are more reasonable, which is conducive to the uniform arrangement of sub-pixels, thereby improving the display quality, and also reduces the difficulty of stretching the mask. On the other hand, the aperture rate of each sub-pixel in the pixel arrangement structure 20 is maximized under the conditions of satisfying the extreme process.

Correspondingly, the second pixel edge of the third sub-pixel 26 has a third length L3, and the second length L2 is set to be 1.5 to 2.5 times the third length L3.

In some embodiments, the length of the first pixel edge of the second sub-pixel 24 is greater than the length of the first pixel edge of the third sub-pixel 26, and the length of the second pixel edge of the second sub-pixel 24 is greater than the length of the second pixel edge of the third sub-pixel 26. In this way, the second sub-pixel 24 has a larger opening area than the first sub-pixel 22 or the third sub-pixel 26.

In an optional embodiment, as shown in FIG. 8, one of the second sub-pixel 24 and the third sub-pixel 26 located in the same first virtual quadrilateral M is configured to be symmetrical about the extension of the line connecting centers of the second sub-pixel 24 and the third sub-pixel 26. This ensures that the shapes of the sub-pixels are more regular, which is conducive to the uniform arrangement of sub-pixels and improves the display uniformity.

In another optional embodiment, as shown in FIG. 8, in the same first virtual quadrilateral M, a distance between the two first pixel edges of the second sub-pixel 24 and the third sub-pixel 26 is the fourth length. In two adjacent first virtual quadrilaterals M in the second direction, a distance between the two second pixel edges of adjacent second sub-pixels 24 and third sub-pixels 26 is the fifth length. The fourth length is equal to the fifth length, which is conducive to the uniform arrangement of sub-pixels and improves the display uniformity.

Figure 9:
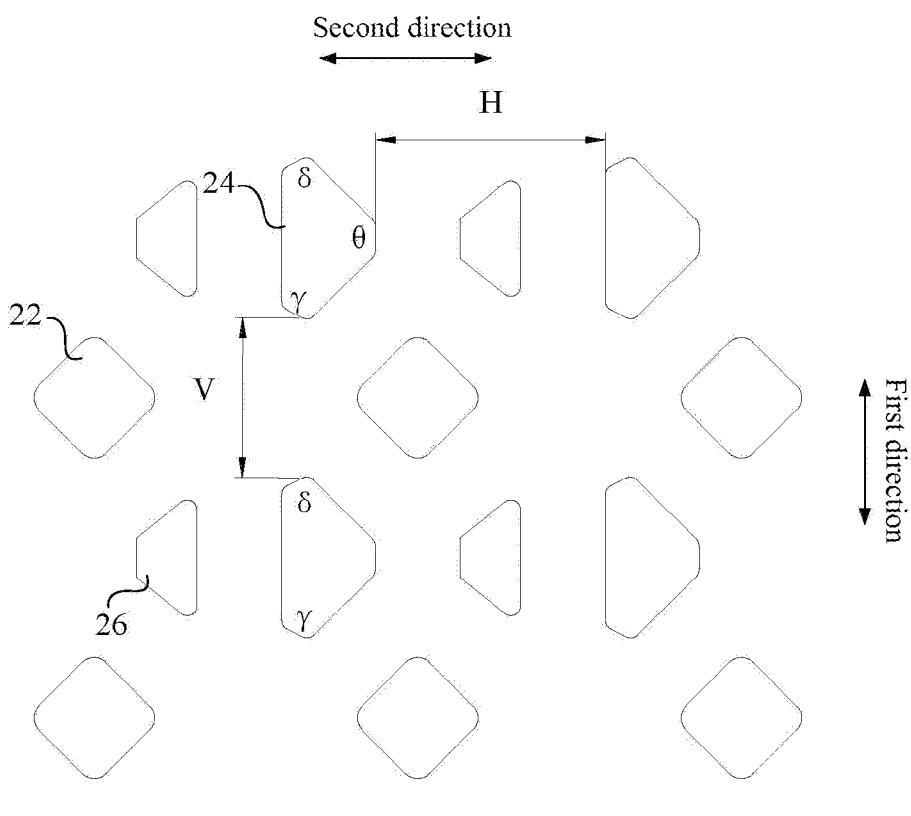
FIG. 9 is a schematic arrangement view of a pixel arrangement structure in another embodiment of the present application.

FIG. 9 shows a schematic arrangement view of a pixel arrangement structure in another embodiment of the present application.

Referring to FIG. 9, in some embodiments, the second sub-pixel 24 has a pixel edge extending along the first direction and a vertex angle θ opposite to this pixel edge in the second direction. Parts of two edges of the vertex angle θ, which are supposed to extend to and intersect at a vertex of the vertex angle θ, form a straight line segment to cause the vertex angle θ to be a flat chamfer, wherein the straight line segment is parallel to the first direction. In other embodiments, parts of the two edges of the vertex angle θ, which are supposed to extend to and intersect at the vertex of the vertex angle θ, form an arc line segment to cause the vertex angle θ to be a round chamfer, wherein a tangent of the arc line segment is parallel to the first direction. As such, on one hand, by forming the flat chamfer or the round chamfer, the difficulty of manufacturing the mask and the vapor deposition are reduced. On the other hand, a distance H between two second sub-pixels in two adjacent first virtual quadrilaterals M in the second direction is increased, further reducing the difficulty of manufacturing the mask and the vapor deposition.

In some embodiments, two adjacent second sub-pixels 24 in the first direction respectively have two opposite vertex angles. For example, in the specific embodiment as shown in FIG. 9, two adjacent second sub-pixels 24 in the first direction respectively have a third vertex angle γ and a fourth vertex angle δ opposite to each other. Parts of two edges of one of the two opposite vertex angles, which are supposed to extend to and intersect at a vertex of the vertex angle, form a straight line segment to cause the vertex angle to be a flat chamfer, wherein the straight line is inclined relative to the first direction. As such, a gap between the organic light-emitting layers of two adjacent second sub-pixels 24 in the first direction is increased, effectively decreasing the color mixing risk of the organic light-emitting layers at the vertex angle, and making the manufacture easy. In addition, a distance V between any second sub-pixel 24 and an adjacent second sub-pixel 24 in the first direction and a distance H between the same second sub-pixel 24 and another second sub-pixel 24 in an adjacent first virtual quadrilateral M in the second direction tend to be close to each other, making the arrangement of sub-pixels more uniform and improving the display effect.

In other embodiments, parts of two edges of one of the two opposite vertex angles i.e., the third vertex angle γ and the fourth vertex angle δ, which are supposed to extend to and intersect at a vertex of the vertex angle, can also form an arc line segment to cause the vertex angle to be a round chamfer, wherein a tangent of the arch line segment is inclined relative to the first direction. As such, the gap between the organic light-emitting layers of two adjacent second sub-pixels 24 in the first direction can also be increased, effectively decreasing the color mixing risk of the organic light-emitting layers at the vertex angle, and making the manufacture easy.

In addition, the term "round chamfer" in the present application refers to an angle formed by rounding an angle of a polygon, and the term "flat chamfer" refers to an angle formed by replacing the arc line segment of the round chamfer with a straight line segment.

It is to be emphasized herein that the jaggedness of the boundary region of the display region 12 is also a factor affecting the display quality. The present inventors have found that if the sub-pixels in different rows form a stepped shape along the extension direction of the boundary region, then the jaggedness of the image at the boundary region of the display panel would be more severe when displaying images, thereby affecting the display effect of the display panel. Therefore, the shape of the first sub-pixel 22 is configured to be defined by pixel edges that are not parallel to the first and second directions, and the second sub-pixel 24 and the third sub-pixel 26 have pixel edges that are not parallel to the first and second directions. This can make the lines formed by the pixel edges of a plurality of sub-pixels located at the edges of the display region 12, especially those located at the irregular edges, tend to coincide with or be parallel to the tangent of the irregular edge, making the lines formed by the plurality of sub-pixel edges smoother and closer to the shape of the irregular edges. This can reduce the jaggedness of the image at the irregular edges and improve the display effect of the display panel.

Figure 10:
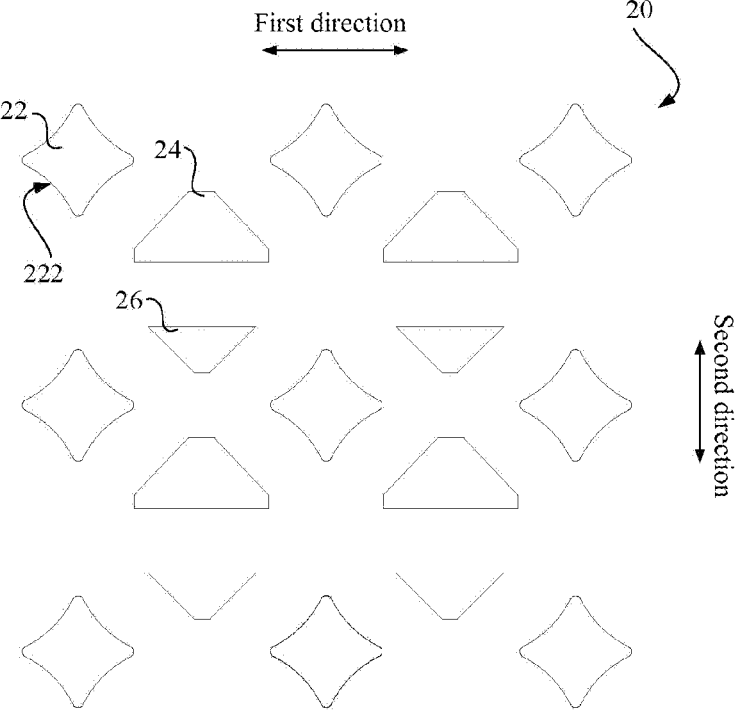
FIG. 10 is a schematic arrangement view of a pixel arrangement structure in yet another embodiment of the present application.

FIG. 10 shows a schematic arrangement view of a pixel arrangement structure in another embodiment of the present application.

At least one pixel edge 222 of the first sub-pixel 22 is configured to be concave toward the center of the first sub-pixel 22. In this way, under the same process conditions, the first sub-pixels 22, the second sub-pixels 24, and the third sub-pixels 26 can be arranged compactly, minimizing the distance between adjacent sub-pixels. Moreover, by configuring the first sub-pixel 22 as a concave polygon or a concave shape composed of curves, the distance between the first sub-pixel 22 and the adjacent second sub-pixel 24 or the adjacent third sub-pixel 26 can be further reduced, so that under the same resolution, the opening areas of the sub-pixels are increased, the aperture ratio is improved, the driving current for the sub-pixels is decreased, and the life of the display panel is increased.

In an embodiment, the pixel edge 222 of the first sub-pixel 22 which is concave toward the center of the first sub-pixel 22 is a curved line or a bending line. It is to be understood that, due to the limitations of the vapor deposition process, the fewer angles on the edge of the sub-pixel, i.e., the more curved the edge is, the less stress is likely to accumulate during vapor deposition, making the vapor deposition easier. Therefore, in an optional embodiment, the pixel edge 222 of the first sub-pixel 22 which is concave toward the center of the first sub-pixel 22 is a curved line. For example, specifically in an embodiment as shown in FIG. 10, the pixel edge 222 of the first sub-pixel 22 which is concave toward the center of the first sub-pixel 22 is arc-shaped.

In some embodiments, the ratio of the maximum distance and the minimum distance between the pixel edge of the first sub-pixel 22 and the opposite pixel edge of the adjacent second sub-pixel 24 or third sub-pixel 26 is in the range of 1 to 1.5, specifically, the ratio can be, for example, 1.1, 1.2, 1.3, or 1.4. This ensures that the distance between adjacent sub-pixels is as uniform as possible, thereby improving the display uniformity.

Based on the same application concept, as shown in FIGS. 5 and 6, the present application also provides a display apparatus 100 that includes the display panel of any above embodiments.

Specifically, the display apparatus 100 can be applied in various fields such as mobile terminal, bionic electronics, electronic skin, wearable equipment, automotive equipment, Internet of Things (IoT) equipment, and artificial intelligence (AI) equipment. For example, the display apparatus 100 can be a digital apparatus such as a mobile phone, a tablet, a handheld computer, iPod, or a smartwatch.

The technical features of the above-mentioned embodiments can be combined arbitrarily. In order to make the description concise, not all possible combinations of the technical features are described in the embodiments. However, as long as there is no contradiction in the combination of these technical features, the combinations should be considered as in the scope of the present application.

The above-described embodiments are only several implementations of the present application, and the descriptions are relatively specific and detailed, but they should not be construed as limiting the scope of the present application. It should be understood by those of ordinary skill in the art that various modifications and improvements can be made without departing from the concept of the present application, and all fall within the protection scope of the present application. Therefore, the patent protection of the present application shall be defined by the appended claims.

What is claimed is:

1. A pixel arrangement structure, comprising:
at least one first sub-pixel having centers coincident with vertexes of a first virtual quadrilateral;
a second sub-pixel located in the first virtual quadrilateral and spaced apart from the first sub-pixels; and
a third sub-pixel located in the first virtual quadrilateral and spaced apart from the first sub-pixels and from the second sub-pixel;
wherein the second sub-pixel has a larger opening area than the first sub-pixel or the third sub-pixel;
wherein two first sub-pixels located on a diagonal of the first virtual quadrilateral are spaced apart from each other by the second sub-pixel and the third sub-pixel located between the two first sub-pixels;
wherein the pixel arrangement structure comprises a plurality of first virtual quadrilaterals repeatedly arranged, the plurality of first virtual quadrilaterals are arranged in rows in a first direction and in columns in a second direction perpendicular to the first direction, and any two adjacent first virtual quadrilaterals share a common virtual edge.

2. The pixel arrangement structure of claim 1, wherein a line connecting centers of the two first sub-pixels located on the diagonal of the first virtual quadrilateral passes through the second sub-pixel and the third sub-pixel located in the first virtual quadrilateral.

3. The pixel arrangement structure of claim 1, wherein a minimum distance between two adjacent first sub-pixels in the first direction is a first distance X, a minimum distance between two adjacent first sub-pixels in the second direction is a second distance Y, and the first distance X and the second distance Y satisfy the following condition: $X=(0.8$ to $1.2)\times Y$.

4. The pixel arrangement structure of claim 1, wherein the first sub-pixel, the second sub-pixel, and the third sub-pixel each have a polygon shape.

5. The pixel arrangement structure of claim 4, wherein the first sub-pixel has a shape configured as a polygon defined by pixel edges which are not parallel to either the first direction or the second direction.

6. The pixel arrangement structure of claim 5, wherein any two adjacent first sub-pixels have two vertex angles opposite to each other.

7. The pixel arrangement structure of claim 5, wherein one of any two adjacent first sub-pixels is configured to be symmetrical about an extension of a line connecting centers of the two adjacent first sub-pixels.

8. The pixel arrangement structure of claim 5, wherein one of the second sub-pixel and the third sub-pixel has a pixel edge which is not parallel to either the first direction or the second direction; and
the pixel edge of one of the second sub-pixel and the third sub-pixel which is not parallel to either the first direction or the second direction is opposite to one pixel edge of the adjacent first sub-pixel.

9. The pixel arrangement structure of claim 8, wherein the second sub-pixel and the third sub-pixel each have a non-equilateral quadrilateral shape;
one of the second sub-pixel and the third sub-pixel has a first pixel edge and a second pixel edge opposite to each other in the second direction, and the first pixel edge has a length larger than a length of the second pixel edge of the same sub-pixel;
the two first pixel edges of the second sub-pixel and the third sub-pixel in the same first virtual quadrilateral are adjacent to and parallel to each other, and the two second pixel edges of two adjacent first virtual quadrilaterals in the second direction are adjacent to and parallel to each other.

10. The pixel arrangement structure of claim 9, wherein the second pixel edge of the second sub-pixel has a first length L1 in the first direction, a maximum size of the first sub-pixel in the first direction is a second length L2, and $L2=(1.5$ to $2.5)\times L1$.

11. The pixel arrangement structure of claim 8, wherein one of the second sub-pixel and the third sub-pixel in the same first virtual quadrilateral is configured to be symmetrical about an extension of a line connecting centers of the second sub-pixel and the third sub-pixel.

12. The pixel arrangement structure of claim 8, wherein two adjacent second sub-pixels in the first direction have two opposite vertex angles;
parts of two edges of one of the two opposite vertex angles, which are supposed to extend to and intersect at a vertex of the vertex angle, form a straight line segment to cause the vertex angle to be a flat chamfer, wherein the straight line segment is inclined relative to the first direction; or
parts of two edges of one of the two opposite vertex angles, which are supposed to extend to and intersect at a vertex of the vertex angle, form an arc line segment to cause the vertex angle to be a round chamfer, wherein a tangent of the arc line segment is inclined relative to the first direction.

13. The pixel arrangement structure of claim 8, wherein the second sub-pixel has a pixel edge configured to be along the first direction and a vertex angle opposite to the pixel edge in the second direction;
parts of two edges of the vertex angle, which are supposed to extend to and intersect at a vertex of the vertex angle, form a straight line segment to cause the vertex angle to be a flat chamfer, wherein the straight line segment is parallel to the first direction; or
parts of two edges of the vertex angle, which are supposed to extend to and intersect at the vertex of the vertex angle, form an arc line segment to cause the vertex angle to be a round chamfer, wherein a tangent of the arc line segment is parallel to the first direction.

14. The pixel arrangement structure of claim 1, wherein at least one pixel edge of the first sub-pixel is configured to be concave toward the center of the first sub-pixel.

15. The pixel arrangement structure of claim 1, wherein a line connecting centers of the second sub-pixel and the third sub-pixel located in the first virtual quadrilateral passes through the center of the first virtual quadrilateral.

16. A display panel, comprising the pixel arrangement structure of claim 1.

17. A display apparatus, comprising a display panel comprising the pixel arrangement structure of claim 1.

18. A pixel arrangement structure, comprising:

at least one first sub-pixel having centers coincident with vertexes of a first virtual quadrilateral;

a second sub-pixel located in the first virtual quadrilateral and spaced apart from the first sub-pixels; and a third sub-pixel located in the first virtual quadrilateral and spaced apart from the first sub-pixels and from the second sub-pixel;

wherein the second sub-pixel has a larger opening area than the first sub-pixel or the third sub-pixel;

wherein two first sub-pixels located on a diagonal of the first virtual quadrilateral are spaced apart from each other by the second sub-pixel and the third sub-pixel located between the two first sub-pixels;

wherein four second sub-pixels respectively located in any four first virtual quadrilaterals adjacent to each other in the first direction and the second direction have centers coincident with vertexes of a second virtual quadrilateral; four third sub-pixels respectively located in the four first virtual quadrilaterals adjacent to each other have centers coincident with vertexes of a third virtual quadrilateral; and the second virtual quadrilateral has an area equal to an area of the third virtual quadrilateral.

* * * * *